United States Patent [19]

Candy

[11] Patent Number: 4,593,271

[45] Date of Patent: Jun. 3, 1986

[54] HIGHER ORDER INTERPOLATION FOR DIGITAL-TO-ANALOG CONVERSION

[75] Inventor: James C. Candy, Neptune, N.J.

[73] Assignee: AT&T Bell Laboratories, Murray Hill, N.J.

[21] Appl. No.: 691,947

[22] Filed: Jan. 16, 1985

[51] Int. Cl.[4] .......................... H03M 1/66; G06F 7/38
[52] U.S. Cl. ............................... 340/347 DA; 364/723
[58] Field of Search ................. 340/347 DA; 364/702, 364/602, 723

[56] References Cited

U.S. PATENT DOCUMENTS

| | | | |
|---|---|---|---|
| 4,006,475 | 2/1977 | Candy et al. | 340/347 DA |
| 4,079,373 | 3/1978 | Brown | 340/347 DA |
| 4,301,446 | 11/1981 | Petit | 340/347 DA |
| 4,467,316 | 8/1984 | Musmann | 340/347 DA |
| 4,528,551 | 7/1985 | Agrawal | 340/347 DA |

OTHER PUBLICATIONS

"Interpolative Digital-to-Analog Converters", G. R. Ritchie et al, IEEE Trans. on Communications, vol. Com-22, No. 11, Nov. 74, pp. 1797-1806.
"The Structure of Quantization Noise from Sigma-Delta Modulation" by J. C. Candy et al, IEEE Trans. on Com, vol. Com-29, No. 9, Sep. 1981, pp. 1317-1323.
"A Voiceband Codec with Digital Filtering" by J. C. Candy et al, IEEE Trans. on Comm, vol. Com-29, No. 6, Jun. 1981, pp. 815-830.

Primary Examiner—Charles D. Miller
Attorney, Agent, or Firm—Patrick E. Roberts

[57] ABSTRACT

Digital signals are processed by a first accumulator to generate most significant bits which represent the signal to be converted but with truncation noise. The error signals from the first accumulator are processed by a second accumulator to generate a second set of most significant bits which are used to remove the truncation noise. The most significant bits from the second accumulator are converted to analog form, differentiated and then combined with the most significant bits from the first accumulator after being converted from digital to analog form. The combined signal is then amplified and filtered.

14 Claims, 6 Drawing Figures

HIGHER ORDER INTERPOLATION FOR DIGITAL-TO-ANALOG CONVERSION

TECHNICAL FIELD

This invention relates to digital-to-analog converters and, in particular, to a digital-to-analog converter with an improved method for interpolating output values by permitting significant reduction in the rate at which the circuits operate or reduction in the number of levels needed for the output.

BACKGROUND OF THE INVENTION

Ordinary digital-to-analog converters (DAC'S) provide a discrete output level for every value of a digital word that is applied to their input. There is difficulty in implementing these converters for long digital words because of the need to generate a large number of distinct output levels. A method for circumventing this difficulty calls for spanning the signal range with a few widely spaced levels and interpolating values between them. The interpolating mechanism causes the output to oscillate rapidly between the levels in such a manner that the average output represents the value of the input code. This technique provides a trade off between the complexity of the analog circuits and the speed at which they operate.

Essential to the technique is an interpolating circuit for truncating the input words shorter output words. These shorter words change their value at high speed in such manner that the truncation noise that lies in the bandwidth of the signal is satisfactorily small.

The above method is disclosed in the following references: (1) "Interpolative Digital-to-Analog Converters" a paper by Messrs. G. R. Ritchie, J. C. Candy, and W. H. Ninke, published in Vol. COM-22, No. 11, November 1974 of the IEEE Transactions on Communications; and, (2) U.S. Pat. No. 4,006,475 issued Feb. 1, 1977 to Mr. J. C. Candy et al.

The aforesaid method uses a simple accumulation of the truncation error to perform interpolation. A problem with this method, however, is that the truncation noise, sometimes referred to quantization noise in the prior art, needs to be reduced. It has been an objective, then, to skew the spectral noise curve in such a way that the noise is substantially moved to high frequency, out of the desired signal band. It has been suggested that the accumulator used for interpolation in the aforesaid Candy patent be replaced by a digital filter. Indeed, such a digital filter is disclosed in U.S. Pat. No. 4,467,316 issued Aug. 21, 1984 to Mr. H. Musmann et al. As shown by curve $S_q''$ in FIG. 4 therein, it is desirable to move the noise out of the signal band to the right.

SUMMARY OF THE INVENTION

Digital-to-analog conversion is achieved by interpolation by using two accumulators, in such a way that truncation noise is moved to higher frequencies out of the desired signal band. Only the most significant bits which are obtained by accumulating the remaining bits drives the output.

More particularly, in the improved interpolator, all the bits of the digital signal are processed by a first accumulator, one word at a time, to generate a stream of most significant bits. The remaining error bits are processed further in the first accumulator and in a second accumulator where a second stream of most significant bits is generated. The most significant bits from the first accumulator represent the signals along with truncation noise. The most significant bits from the second accumulator represent the compensation for the truncation noise.

In one embodiment of the interpolator, the most significant bits from the second accumulator are digitally differentiated and digitally added to the most significant bits from the first accumulator and the resulting signal is then converted to analog form.

In another more simple embodiment, the most significant bits from the second accumulator are converted to analog form, differentiated and then combined with the significant bit from the first accumulator after its conversion to analog form. The combined signal is then amplified and filtered to obtain the desired analog signal which is substantially free from truncation noise.

The advantage of the present invention, of using the second accumulator, resides in the noise curve being changed to a second degree, thereby reducing the amount of noise within the baseband.

DETAILED DESCRIPTION

Figure 1:
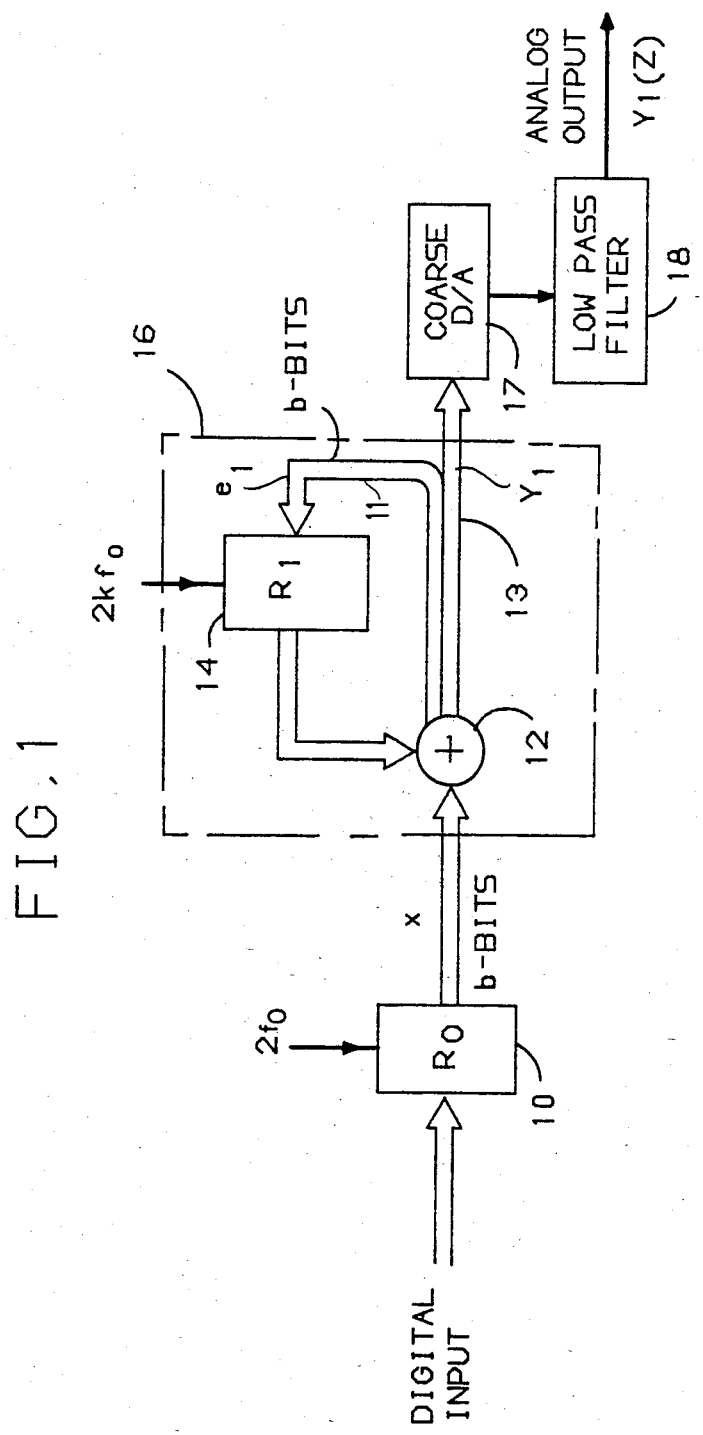
FIG. 1 shows a prior art digital-to-analog converter.

Referring to FIG. 1, there is shown a basic interpolating circuit 16 that is used as part of a circuit for converting signals from digital form to analog. Digital signals are entered as words one at a time in input register 10. The contents of register 10 are fed to one port of a binary adder 12 the output from which is separated into two paths 11 and 13. Binary adder 12 and feedback register 14 together form an accumulator. The more significant component along path 13 feeds to the output via circuit 17 and low pass filter 18 while the less significant component along path 11 feeds to a second port of binary adder 12 via feedback register 14. Whereas input register 10 loads at the incoming word rate, $2f_0$, feedback register 14 operates k times faster at $2kf_0$. If the period of the faster clock is represented by $\tau$, then $$2kf_0\tau=1 \tag{1}$$

The output, from this circuit, expressed as its z-transform is $$Y_1(z)=X(z)-(1-z^{-1})E_1(z), \tag{2}$$

where $$z=\exp(juu\ \tau),$$

$X(z)$ = the z-transform of the input digital word, and
$Y_1$ = the input contaminated by a truncation noise $E_1$ which is filtered by the high pass function $(1-z^{-1})$.

The interpolating converter is implemented most easily and its action easily explained when the digital signals are expressed in displaced binary notation rather than in two-compliment or signmagnitude. This notation is used throughout this disclosure. Let the input word to binary adder 12 comprise b bits and let the error $e_1$ comprise the $\beta$ least significant bits of the sum, which is fed back to register 14. Then the output $y_1$ from accumulator 16 comprises the $(b - \beta + 1)$ most significant bits, the extra bit being the carry from the top of adder 12. Input codes can assume integer values from 0 through $(2^b - 1)$, the error integer values from 0 through $(2^\beta - 1)$ while the output assumes integer multiples of $2^\beta$ in the range 0 through $2^b$. The number of levels needed to represent the output is only $$l_1 = (2^{b-\beta} + 1) \tag{3}$$

The switching between levels, however, needs to be fast enough to suppress the truncation noise that enters the signal band. The frequency ratio, k, that is needed in order to obtain resolutions comparable to b bit PCM is calculated hereinbelow.

The truncation error $e_1$, comprises a constant term $0.5(2^\beta - 1)$ and a noise that fluctuates with uniform probability in the range $\pm 0.5(2^\beta - 1)$, its rms value being $$\frac{(2^\beta - 1)}{\sqrt{12}}.$$

If the signals applied to the converter are assumed to be sufficiently busy to make this noise random with white spectral density $$E_1(f) = \frac{(2^\beta - 1)}{\sqrt{12kf_0}} \tag{4}$$

then the spectral density of the noise in the output is given by $$N_1(f) = E_1(z)(1 - z^{-1}) \tag{5}$$

$$= \frac{(2^\beta - 1)}{\sqrt{3kf_0}} \sin\left(\frac{\pi f}{2kf_0}\right)$$

It is noted that the direct current offset is filtered away. The net noise in the signal band $0 < f < f_0$ can be expressed as $$N_{1o} = (2^\beta - 1)\sqrt{\frac{1 - \text{sinc}\left(\frac{1}{k}\right)}{6k}} \tag{6}$$

where $$\text{sinc}(x) = \frac{\sin \pi x}{\pi x}.$$

Equation (6) can be approximated by $$N_{1o} \approx \frac{\pi(2^\beta - 1)}{6k\sqrt{k}}, \tag{7}$$

when $k^2 >> 0.25.$

This noise is compared with the truncation noise, the rms value for which is $$\frac{1}{\sqrt{12}},$$

that is inherent in the input. For the interpolation noise of equation (7) to be smaller, it is required that $$k^3 > \tfrac{1}{3}\pi^2(2^\beta - 1)^2. \tag{8}$$

For example, when $b = 26$ and $\beta = 12$, k should exceed 381. This requires an inrerpolation rate in excess of 3 MHz and 17 levels of output signal for 4 KHz voiceband signals. This is shown in a paper entitled "A Voiceband Codec with Digital Filtering" appearing in Volume COM-29, No. 6, June 1981 of IEEE Transactions on Communications by J. C. Candy et al. The case where the output has only two levels is particularly important for practical implementation. For this converter to have 16-bit resolution requires that $\beta = 16$ and k exceed 2,418 which corresponds with a 19 MHz interpolation rate for voiceband signals. Such high rates are a handicap that can be avoided by improving the filtering of the truncation noise. An obvious method replaces feedback register 14 by more complex digital processing as shown in the Musmann et al patent, which was discussed briefly in the background section of this disclosure. A better method is disclosed hereinbelow.

Figure 2:
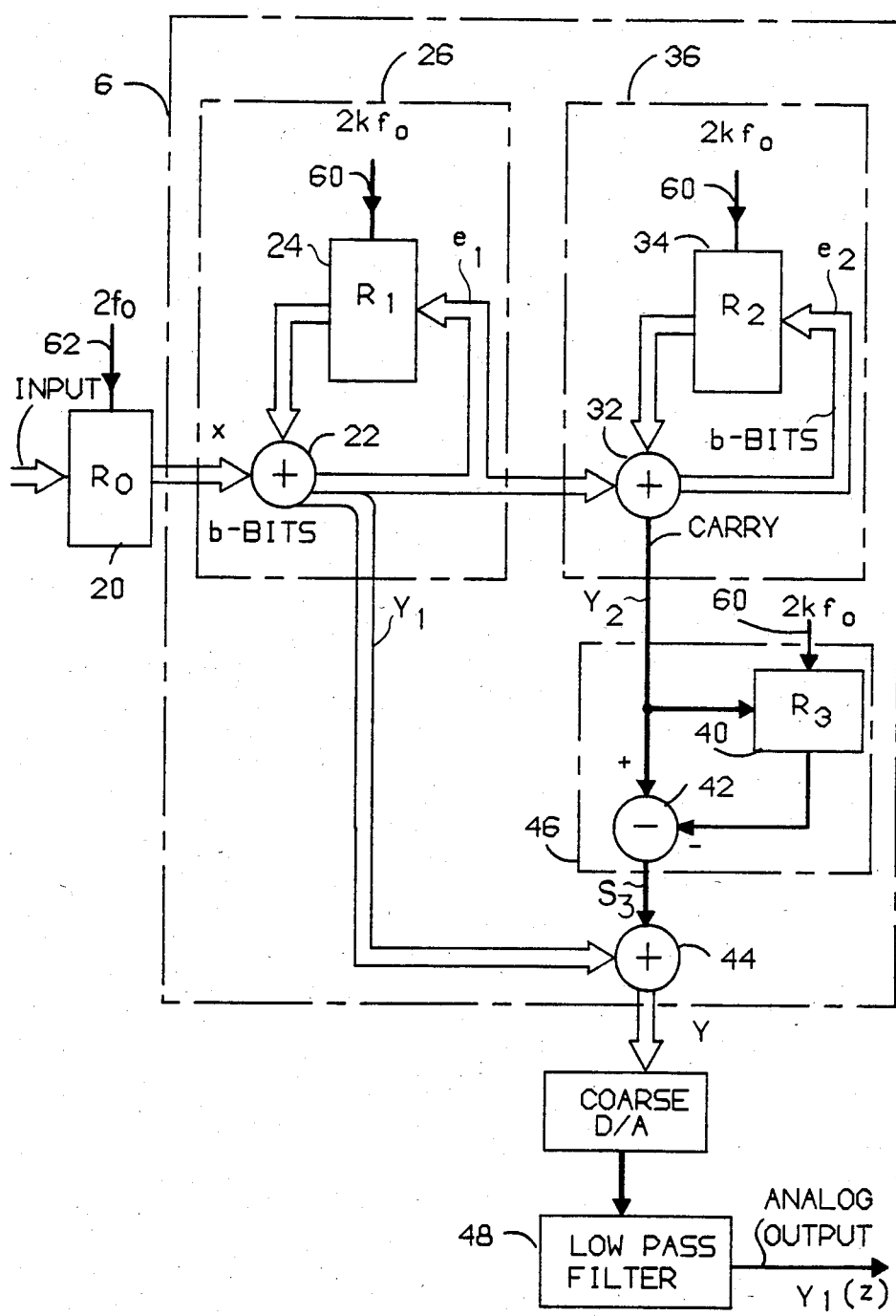
FIG. 2 shows a digital to analog converter embodying the present invention.
Figure 3:
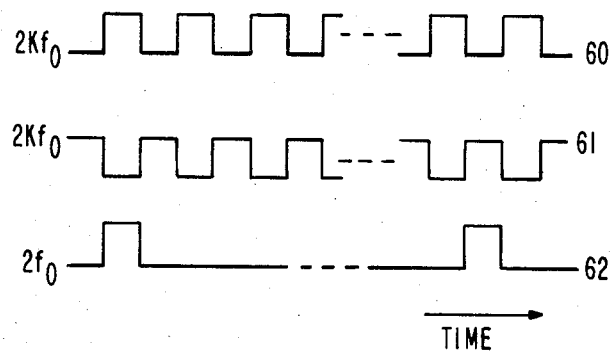
FIG. 3 shows the timing diagram for FIG. 2.

Referring to FIG. 2, there is shown a converter that uses two accumulators 26 and 36 in the interpolator 6 to reduce the amount of truncation noise which enters the signal band. The timing diagram is shown in FIG. 3. The output from the interpolator may be expressed in the form $$Y(z) = Y_1(z) + (1 - z^{-1})Y_2(z) \tag{9}$$

$$= X(z) - (1 - z^{-1})^2 E_2(z). \tag{10}$$

When the error $e_2$ is random, the spectral density of the noise present in the output is given by $$N_2(f) = (1 - z^{-1})^2 E_2(f) \tag{11}$$

$$= \frac{(2^\beta - 1)}{3kf_0}\left(1 - \cos\left(\frac{\pi f}{kf_0}\right)\right)$$

and the net noise in the signal band is approximated by $$N_{2o} \approx \frac{\pi^2(2^\beta - 1)}{2k^2\sqrt{15k}} \tag{12}$$

when $k^2 >> 1.5$.

The number of levels needed in the output is $$l_2 = (2^{b-\beta} + 3). \tag{13}$$

In order for the noise, of equation (12), to be less than the noise in b bit PCM requires that $$k^5 > \frac{\pi^4 (2^\beta - 1)^2}{5} \quad (14)$$

For example, with b=16 and $\beta=12$, k should exceed 51. This corresponds with an interpolation rate of only 404 KHz and 19 level outputs for voiceband signals. When $\beta=b$, four level output interpolating in excess of 1.25 MHz would provide the resolution of 16-bit PCM.

The output from the interpolator shown in equation (9 comprises two components: $y_1$, representing the carry bits from accumulator 26, carries the signal contaminated with noise shown in equation (2) to summer 44, and $y_2$, representing the carry bits from accumulator 36, compensating for the interpolation noise.

Figure 4:
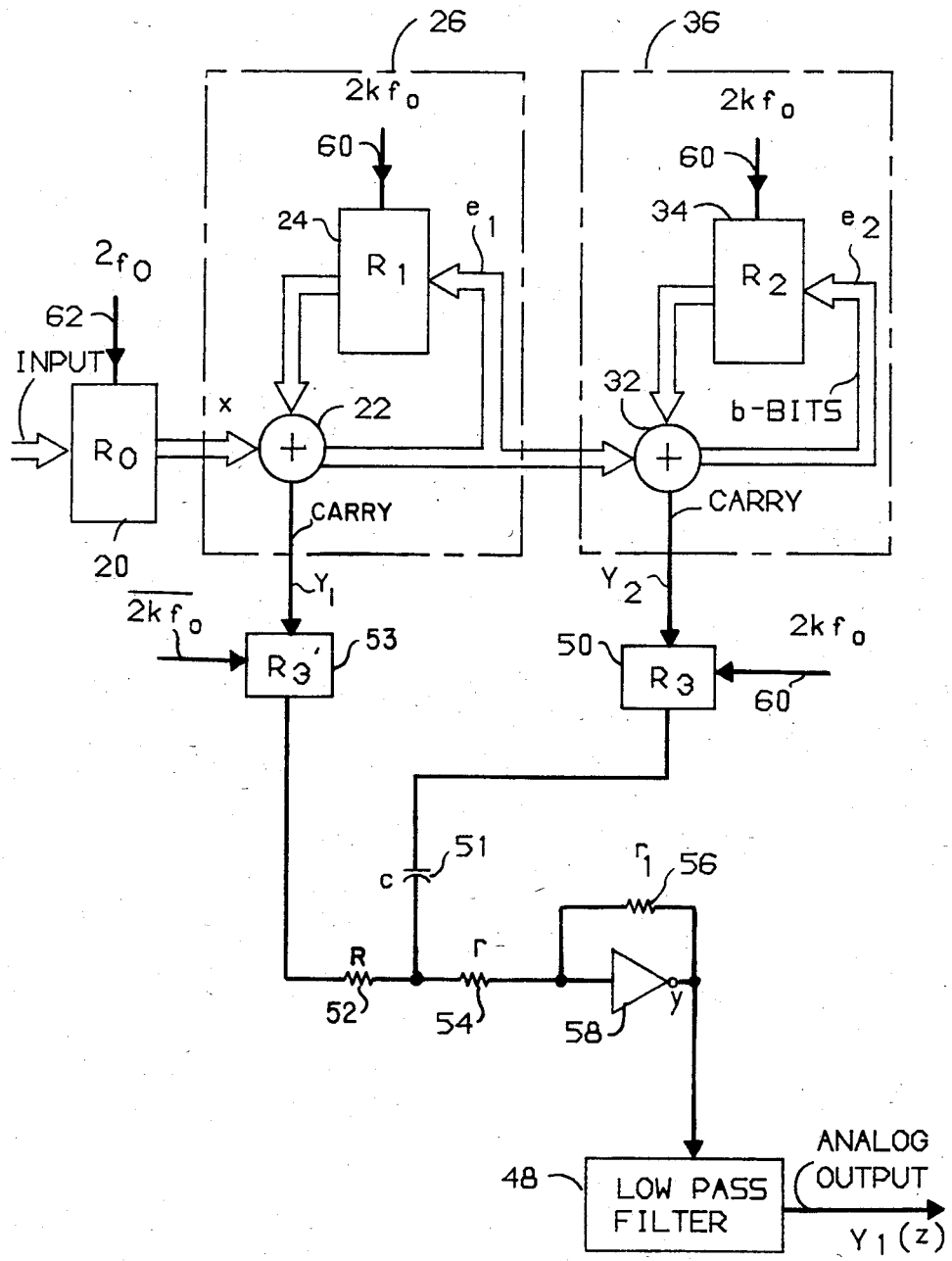
FIG. 4 shows a different embodiment of the present invention.

Converting these two signals into analog form by separate means, as shown by elements 50 and 53 in FIG. 4, significantly improves the tolerance of the circuit to inaccuracies. Two level conversion of $y_1$ avoids signals distortion caused by misplaced levels. Likewise, two level conversion for $y_2$ is desirable but this requires analog differentiation to replace the digital differentiation done by register 40 and subtracter 42, both elements of FIG. 2.

The approximation of digital differentiation by analog differentiation is satisfactory in circuits such as this where the word rate far exceeds the signal frequency, because $$(1 - z^{-1}) = 2j \exp\left(-\frac{j\omega\tau}{2}\right) \sin\left(\frac{\omega\tau}{2}\right) \quad (15)$$

and $$(1 - z^{-1}) \approx j\omega\tau \exp\left(-\frac{j\omega\tau}{2}\right) \quad (16)$$

when $$(\omega\tau)^2 << 24;$$

or $$(1 - z^{-1}) \approx j\omega\tau \quad (17)$$

where $$\omega\tau << 2.$$

Referring to FIG. 4, registers 50 and 53, clocked respectively by clock pulse streams 60 and 61, provide a half period delay in $y_2$ with respect to $y_1$ and capacitor 51 differentiates $y_2$. The net output of this circuit may be expressed as $$Y = G\left(Y_1 + j\omega RC \left(\exp\left(-\frac{j\omega\tau}{2}\right)(Y_2)\right)\right) \quad (18)$$

and this can be equivalent to equation (9) in the signal band provided that equation (16) is valid and that $$RC \approx \tau \quad (19)$$

where $$\tau = \frac{1}{2kf_0}. \quad (20)$$

The net gain of the analog circuit to the signal is $$G = \frac{r_1}{(R + r)}\left(1 + \frac{j\omega rRC}{r + R}\right). \quad (21)$$

It cuts off at a frequency that is $$\frac{k(R + r)}{\pi r}$$

higher than signal frequencies. The purpose of this low pass filtering, introduced by the presence of resistance 54, is to stop high frequency components of the binary signal $y_2$ from destroying amplifier 58.

It can be shown that the approximation of equation (b 16) is good for this application and that relationship (19) must be satisfied to 1 part in k. The least significant $$\frac{3}{5}(\beta - 1)$$

bits of the signal that feeds from the first accumulator 26 to the second accumulator 36 may be truncated. This permits the circuit to be simpler and inexpensive. The aforesaid reasoning has been confirmed by measurements actually made. The results also show a close resemblance between properties of these interpolating circuits and those of sigma delta modulators.

In order to visualize the results of this invention and to distinguish interpolation noise from spurious circuit imperfection and from the quantization of the input signal, a circuit using low switching rates was used. The input comprised 16-bit words generated by a computer at 8 KHz. It represented direct current levels and 870 Hz sinusoidal waves of various amplitudes. The lowpass filter 48, of FIG. 4, at the output of the converter approximated C-message weighting. The cut-off frequency of the filter was about 3 KHz.

Figure 5:
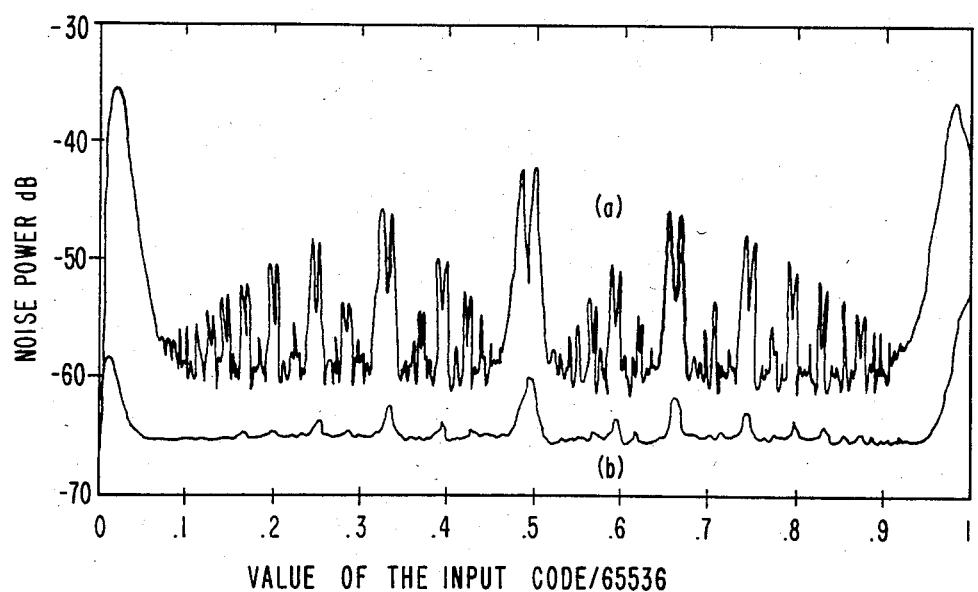
FIG 5 shows a comparison of the analog signal obtained from the use of the converters of FIG. 1 and FIG. 2.

Referring to FIG. 5, there is shown graphs of the noise at the output of the converter, plotted in decibels against the value of the binary code as it swept slowly through the entire range 0 through 65,535. Curve (a) is for single accumulation, using the converter of FIG. 1, or the converter of FIG. 2 or FIG. 4 with the output $y_2$ from accumulator 36 disconnected, and curve (b) is for double accumulation using the converter of FIG. 2. It can be seen readily that the use of a converter with double accumulation causes the noise to be lowered and to be de-correlated in much the same way as in sigma delta modulation.

Figure 6:
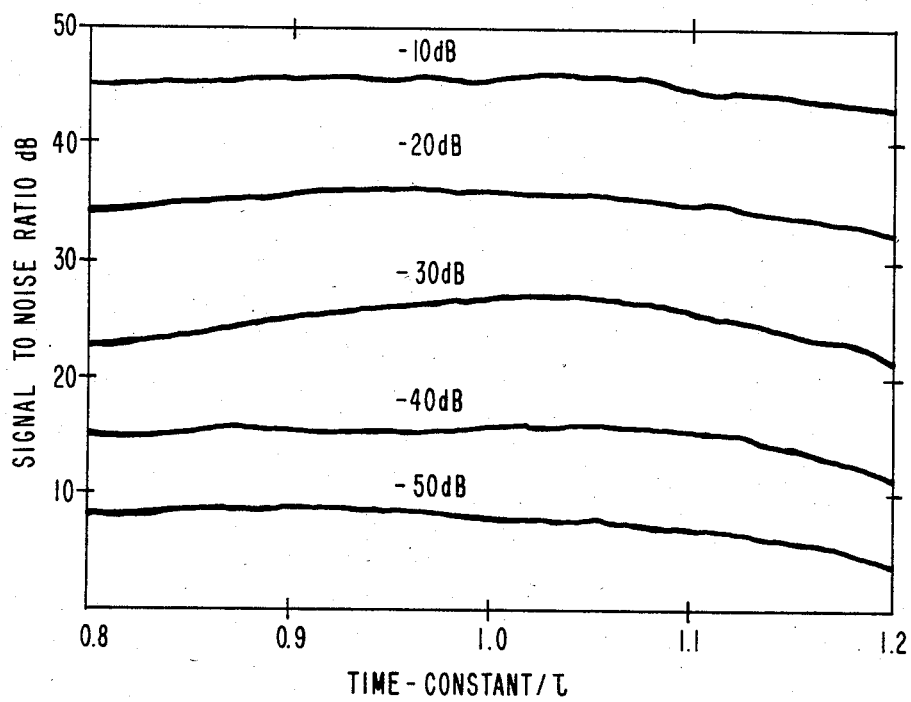
FIG. 6 illustrates a stable signal to noise characteristic of the converter embodying the present invention over a varying time constant.

Referring to FIG. 6, there is shown the signal-to-noise ratio plotted against the deviation of the time constant RC from the ideal value $\tau$. It can be seen that the signal-to-noise ratio remains fairly constant for a range of time constants from 0.8 to 1.2.

It will be clear to those skilled in the art that the improvement brought about by the use of two accumulators instead of one can be extended any number of times by replacing the last accumulator 36 in FIG. 2 by two accumulators and a differentiator, in just the same way that elements 26, 36 and 46 of FIG. 2 replace element 16 of FIG. 1.

What is claimed is:

1. An improved digital-to-analog converter comprising an input register for temporarily storing digital signals therein and for supplying said digital signals to a first accumulator for a first stream of most significant bits and the remaining bits as error bits, said first accumulator operating at a predetermined rate faster than said input register and means for converting the digital signals to analog form, the improvement comprising a second accumulator for receiving said error bits from said first accumulator as its input signal and for producing a second stream of most significant bits, a digital circuit for differentiating said second most significant bits, a binary adder for adding said most significant bits from said first accumulator and said second most significant bits from said second accumulator for producing a digital signal substantially free from truncation noise.

2. The converter of claim 1 wherein said digital circuit for differentiating said second most significant bits from said second accumulator comprises a register which operates at the same rate as said first accumulator and a subtracter.

3. The converter of claim 1 wherein said second accumulator comprises a second binary adder for receiving said error bits from said first accumulator, for generating said second most significant bits and for returning error bits comprising the bits other than said second most significant bits to a second feedback register which operates at the same rate as said first accumulator.

4. An improved digital-to-analog converter comprising an input register for temporarily storing digital signals therein and for supplying said digital signals to a first accumulator which has a first binary adder for receiving said digital signals from said first input register, for generating most significant bits, and for returning the remaining bits as first error bits to a first feedback register which operates at a rate faster than said input register and means for converting said digital signals to analog signals, said improvement comprising a first forward register which operates at the same rate as said first accumulator for temporarily storing said most significant bits and first means for converting said most significant bits from digital to analog form, a second accumulator for receiving said first error bits from said first binary adder of said first accumulator and for generating second most significant bits, a second forward register which operates at the same rate as said first accumulator for temporarily storing said second most significant bits and second means for converting said second most significant bits from digital to analog form, and means for amplifying said analog signals.

5. The converter of claim 4 wherein said first and second means for converting said most significant bits and said second most significant bits, respectively, together comprise a resistor capacitor (RC) filter, said most significant bits being supplied to one end of said resistor of said RC filter and said second most significant bits being supplied to one end of said capacitor or said RC filter and the other ends of said resistor and said capacitor being connected together with the input of said amplifier.

6. The converter of claim 5 wherein said amplifier has an input resistor sufficiently large to protect said amplifier against spurious signals.

7. The converter of claim 4 wherein said second accumulator comprises a second binary adder for receiving said first error bits from said first binary adder of said first accumulator, for generating said second most significant bits and for returning said second error bits to a second feedback register which operates at the same rate as said first accumulator.

8. An improved method for interpolating output values in a digital-to-analog converter comprising the steps of generating a first stream of most significant bits in a first accumulator from the digital bits which are input to said first accumulator the remaining bits being first error bits and being further processed in said first accumulator, wherein said improvement comprises the steps of generating a second stream of most significant bits in a second accumulator from said first error bits and processing the remaining bits further, digitally differentiating said most significant bits from said second accumulator, and digitally adding said differentiated most significant bits from said second accumulator with said most significant bits from said first accumulator, thereby substantially reducing the truncation noise caused by said converter.

9. An improved method for interpolating output values using two level conversion in a digital-to-analog converter comprising the steps of processing the digital bits in a first accumulator to generate most significant bits representing the signal contaminated with truncation noise, the remaining error bits being further processed, wherein the improvement comprises the steps of processing said error bits in a second accumulator to generate most significant bits which are used to compensate for the truncation noise in said most significant bits from said first accumulator, differentiating said most significant bits from said second accumulator after converting said most significant bits from said second accumulator from digital to analog form, converting said most significant bits from said first accumulator to analog form, combining said most significant bits from said first accumulator and said differentiated most significant bits from said second accumulator and amplifying the resulting signal which is then filtered to obtain the desired analog signal which is free from substantially all truncation noise.

10. A compound interpolator comprising a first interpolator for receiving a digital signal and for producing a first digital output and an error signal, a second interpolator for receiving said error signal and for producing a second digital output, a differentiating circuit for producing the derivative of said second digital output, a combining circuit for summing said first digital output with said derivative of said second digital output to produce the output signal from said compound interpolator.

11. The compound interpolator of claim 10 wherein said first interpolator is an accumulator for producing said first digital output which comprises a stream of most significant bits and for producing said error signal which comprises a stream of least significant bits.

12. The compound interpolator of claim 11 wherein said second interpolator is an accumulator for producing said second digital output which comprises a second stream of most significant bits.

13. The compound interpolator of claim 11 wherein said second second interpolator comprises two accumulators for producing said second digital output which comprises a second stream of most significant bits.

14. A digital-to-analog converter comprising
an input register for temporarily storing digital signals therein and for supplying said digital signals to a compound interpolator, said compound interpolator operating at a predetermined rate faster than input register, and means for converting the output signal from said interpolator to analog form,
compound interpolator comprising
a first interpolator for receiving said digital signals and for producing a first digital output and an error signal,
a second interpolator for receiving said error signal and for producing a second digital output,
a differentiating circuit for producing the derivative of said second digital output,
a combining circuit for summing said first digital output with said derivative of said second digital output to produce said output signal from said compound interpolator.

* * * * *